United States Patent
Mithal et al.

(10) Patent No.: US 6,822,327 B1
(45) Date of Patent: Nov. 23, 2004

(54) FLIP-CHIP INTERCONNECTED WITH INCREASED CURRENT-CARRYING CAPABILITY

(75) Inventors: Pankaj Mithal, Kokomo, IN (US); William D. Higdon, Greentown, IN (US); Mark W. Gose, Kokomo, IN (US); John M. Dikeman, Kokomo, IN (US); Frank Stepniak, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/461,318

(22) Filed: Jun. 13, 2003

(51) Int. Cl.[7] ................................. H01L 29/40
(52) U.S. Cl. .................. 257/734; 257/773; 257/782; 257/786
(58) Field of Search .................. 257/734–736, 257/773, 786, 780

(56) References Cited

U.S. PATENT DOCUMENTS

| | | | |
|---|---|---|---|
| 3,902,189 A | * | 8/1975 | Simpson ............... 257/666 |
| 5,438,749 A | | 8/1995 | Runyon |
| 5,491,364 A | | 2/1996 | Brandenburg et al. |
| 6,064,576 A | * | 5/2000 | Edwards et al. ........ 361/776 |
| 6,259,608 B1 | | 7/2001 | Berardinelli et al. |
| 2003/0193078 A1 | * | 10/2003 | Chungpaiboonpatana et al. ............ 257/664 |

OTHER PUBLICATIONS

U.S. patent application Ser. No. 10/075,979, Yeh et al., filed Feb. 15, 2002.
U.S. patent application Ser. No. 10/226,370, Yeh et al., filed Aug. 22, 2002.
U.S. patent application Ser. No. 10/252,502, Carter et al., filed Sep. 23, 2002.

* cited by examiner

Primary Examiner—Wael Fahmy
Assistant Examiner—Nathan W. Ha
(74) Attorney, Agent, or Firm—Stefan V. Chmielewski

(57) ABSTRACT

A metal runner that improves the current-carrying capability of solder bumps used to electrically connect a surface-mount circuit device to a substrate. The runner comprises at least one leg portion and a pad portion, with the pad portion having a continuous region and a plurality of separate electrical paths leading to and from the continuous region. The electrical paths are delineated in the pad portion by nonconductive regions defined in the pad portion, with at least some of the nonconductive regions extending into the leg portion. The multiple electrical paths split the current flow to and from the solder bump, distributing the current around the perimeter of the solder bump in a manner that reduces current density in regions of the solder bump where electromigration is most likely.

20 Claims, 3 Drawing Sheets

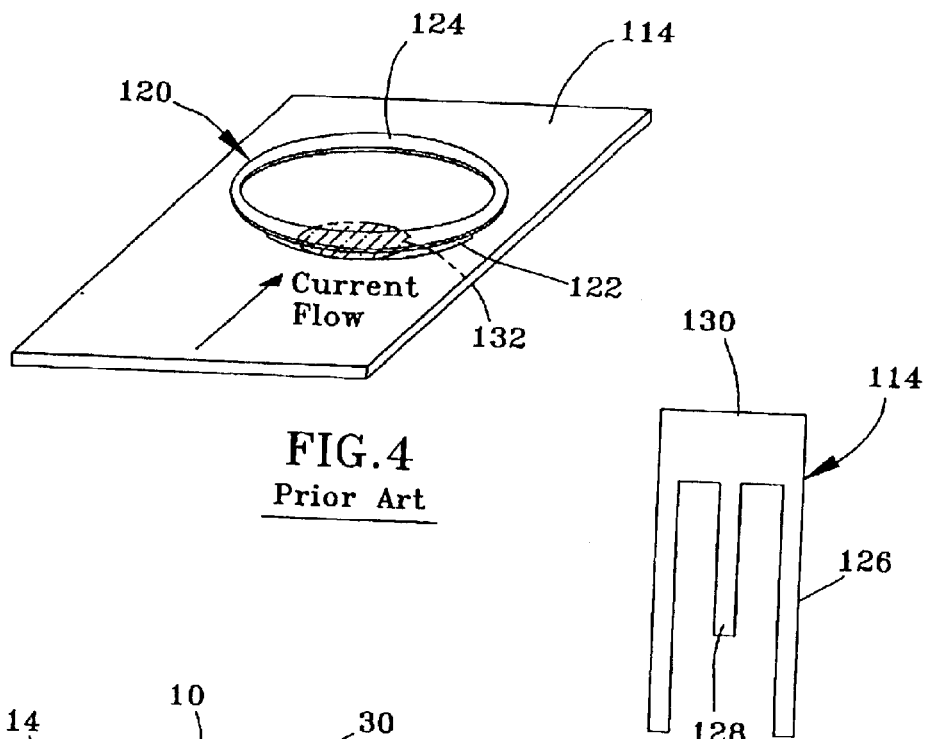
FIG.4
Prior Art
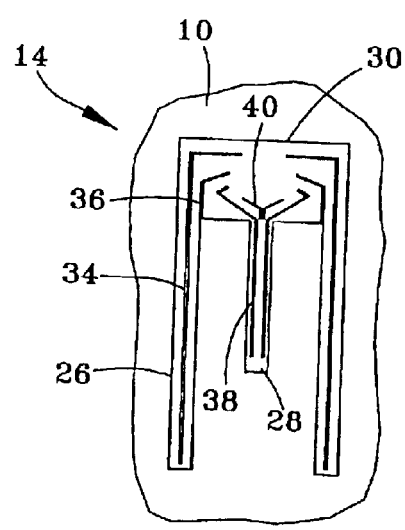
FIG.5
Prior Art
FIG.6
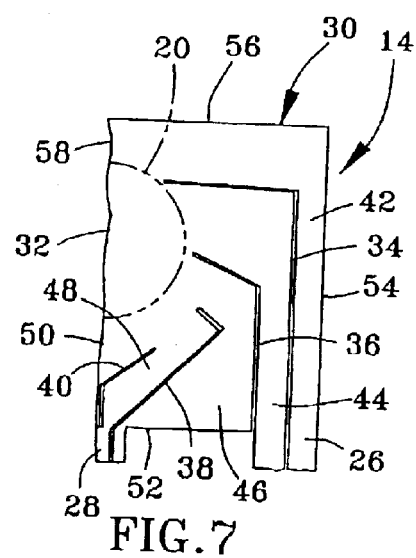
FIG.7

FLIP-CHIP INTERCONNECTED WITH INCREASED CURRENT-CARRYING CAPABILITY

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to circuit devices of the type that are attached to a substrate with multiple solder connections. More particularly, this invention relates to conductive layers on such a device, wherein the conductive layers are configured to promote the current-carrying capability of the solder connections of the device.

(2) Description of the Related Art

Surface-mount (SM) semiconductor devices such as flip chips and ball grid arrays (BGA's) are attached to substrates with beadlike terminals formed on interconnect pads located on one surface of the device. The terminals are usually in the form of solder bumps that, after placement of the chip on the substrate, are reflowed to both secure the chip to the substrate and electrically interconnect the flip chip circuitry to a conductor pattern on the substrate. Reflow soldering techniques typically entail depositing a controlled quantity of solder on the interconnect pads using methods such as electrodeposition and printing, and then heating the solder above its melting or liquidus temperature (for eutectic and noneutectic alloys, respectively) to form a solder bump on each pad. After cooling to solidify the solder bumps, the chip is attached to the conductor pattern by registering the solder bumps with their respective conductors on the substrate, and then reheating (reflowing) the solder so as to form solder connections that are metallurgically bonded to the interconnect pads on the chip and the conductors on the substrate.

Aluminum or copper metallization is typically used in the fabrication of integrated circuits, including the interconnect pads on which the solder bumps of a flip chip are formed. Thin layers of aluminum or copper are chemically deposited on the chip surface, and then selectively etched to achieve the desired electrical interconnects on the chip. The number of metal layers used for this purpose depends on the complexity of the integrated circuit (IC), with a minimum of two metal layers typically being needed for even the most basic devices. Aluminum and its alloys are generally unsolderable and susceptible to corrosion if left exposed, and copper is readily dissolved by molten solder. Consequently, a diffusion barrier layer is required on top of copper interconnect metal, while an adhesion layer is required for aluminum interconnect metal. These layers, along with one or more additional metal layers, are deposited to form what is termed an under bump metallurgy (UBM) whose outermost layer is readily solderable, i.e., can be wetted by and will metallurgically bond with solder alloys of the type used for solder bumps.

FIGS. 1, 2 and 3 represent, respectively, a perspective view of an IC die 110, a perspective view of a region of the die 110 that includes a pair of solder bumps 112, and a cross-sectional view through one of the solder bumps 112. The solder bumps 112 are electrically connected to metal runners 114 on the die 110 through openings in a passivation layer 116 (shown only in FIG. 3). The metal runners 114 overlie a second metal layer 118 on the die 110, through which connections are made to the integrated circuit (not shown) on the die 110. The portions of the runners 114 exposed through the passivation layer 116 define interconnect pads on which UBM's 120 have been deposited. As an example, the UBM 120 is represented as comprising a solderable metal (e.g., NiVCu) layer 124 deposited on an aluminum pad 122.

As a result of die attachment, the solder bumps 112 form solder connections that carry electrical currents in and out of the die 110, such that an inherent potential difference is established between the two ends of each bump 112, i.e., the end attached to the die 110 and the opposite end attached to the substrate (not shown). It has been noted that, in combination with operating temperature, the electrical current through a solder bump connection can lead to a phenomenon known as "electromigration." In its simplest form, electromigration, as it relates to the die 110 represented in FIGS. 1 through 3, can be defined as the separation and movement of the metallic phases within the solder bump 112, such as the tin and lead phases within a bump 112 formed of a Sn-Pb solder alloy. In other words, the solder bump 112, which is essentially a homogenous mixture of these phases, becomes segregated with one phase accumulating near the die 110 and the other phase accumulating near the substrate. This segregation is detrimental to the long term reliability and performance of the solder bump connection, and in some cases can lead to "electrically open" solder joints.

Flip chip solder connections used in high power applications, such as output drivers for automotive engine controllers, are particularly likely to exhibit excessive resistances and open connections associated with electromigration. It would be desirable if the reliability of these solder connections could be improved by increasing their current-carrying capability.

BRIEF SUMMARY OF THE INVENTION

The present invention is directed to improving the current-carrying capability of solder bump connections between metal layers on a surface-mount circuit device and a substrate to which the device is attached with the connections. The present invention employs a metal layer comprising at least one leg portion and a pad portion, with the pad portion having a continuous region and a plurality of separate electrical paths leading to and from the continuous region. The electrical paths are delineated in the pad portion by nonconductive regions, such as openings defined in the pad portion, with at least some of the openings preferably extending into the leg portion.

The metal layer of this invention is adapted to carry current to and from a solder bump electrically connected to the continuous region. The multiple electrical paths split the current flow to and from the solder bump, and distribute the current around the perimeter of the solder bump in a manner that reduces current density in regions of the solder bump where current would otherwise be concentrated. While current density can also be reduced by increasing the thickness of the metal, the present invention achieves reduced current densities without the cost of the additional metal required to increase the thickness of the metal layer. The multiple electrical paths of the metal layer can be defined in the metal layer during conventional processes undertaken to pattern the metal layer on the device surface.

Other objects and advantages of this invention will be better appreciated from the following detailed description.

BRIEF DESCRIPTION OF THE DRAWINGS

FIG. 4 is a perspective view of an interconnect pad region of a metal runner, including a UBM formed thereon, in accordance with the prior art.

FIG. 5 is a plan view of a metal runner of the type shown in FIG. 4, prior to forming the UBM.

FIGS. 6 and 7 are plan views of, respectively, a metal runner and a detailed view of the interconnect pad region of the metal runner in accordance with an embodiment of the present invention.

DETAILED DESCRIPTION OF THE INVENTION

Figure 1:
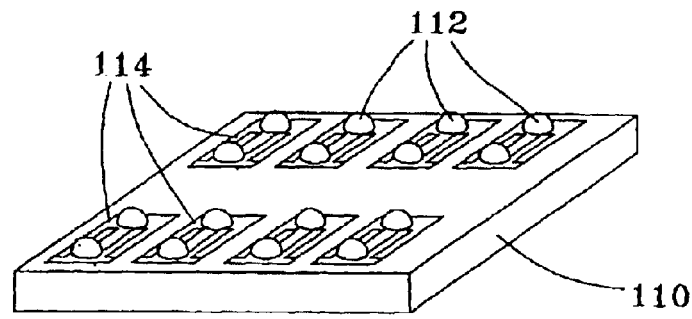
FIG. 1 represents a perspective view of a flip chip.
Figure 2:
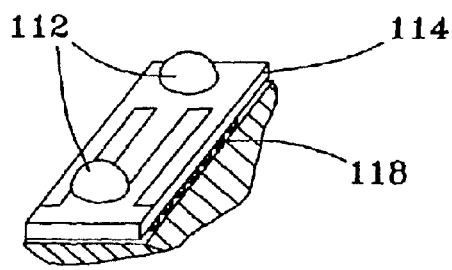
FIG. 2 is a perspective view of a portion of the chip of FIG.
Figure 3:
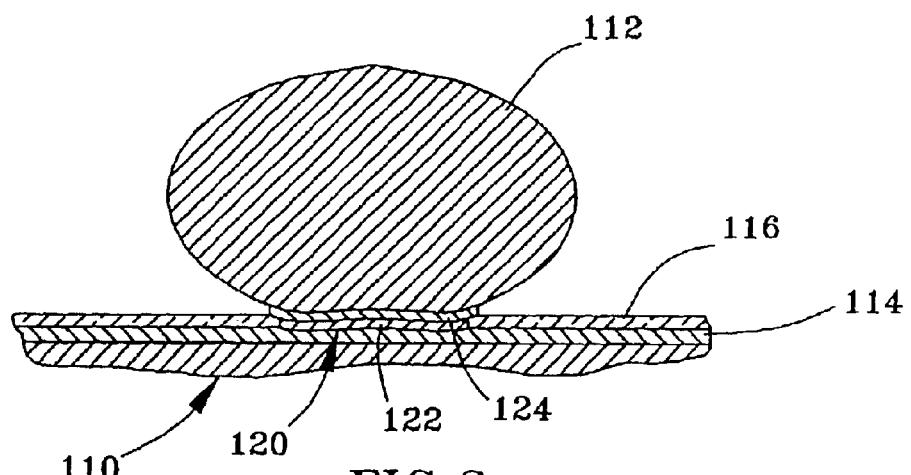
FIG. 3 represents a cross-sectional view of one of the solder bumps of FIG. 2 in accordance with the prior art.

The present invention is directed to improving the reliability of surface-mount devices, such as flip chips of the type represented in FIGS. 1 through 3. According to one aspect of the present invention, current density within a solder bump (e.g., 112 in FIGS. 1 through 3) significantly contributes to electromigration, and therefore controlling current density can be effective in minimizing and preventing open solder connections caused by electromigration. Current density in a structure is defined as current flow per unit area (in a plane perpendicular to the direction of current flow) at various points in a structure, and is a good indicator of least resistant paths for electrical current flow through the structure.

In an investigation leading to this invention, it was observed that portions of a solder bump that have considerably higher current density than the bulk of the solder bump are more prone to electromigration. A solder bump inherently poses some level of resistance to current flow. In the investigation, it was shown that the bulk of the current flowing through a solder bump tends to flow through a very small portion of the bump. FIG. 4 depicts a portion of one of the metal runners 114 and its UBM 120 from FIGS. 1 through 3 (without the solder bump 112), and schematically represents current flow as being concentrated in a limited peripheral area 132 of the UBM 120 nearest the source of current flow, resulting in what may be termed "current crowding" in the solder bump. Damage from electromigration is a nonlinear function of current, such that current crowding leads to a significant increase in damage to a solder connection. On the other hand, if it were possible to achieve even a small reduction in current density, the damage to a solder connection from electromigration could be significantly reduced, thereby improving the reliability and performance of a solder connection.

FIG. 5 depicts the layout of a runner 114 of the type used in the die 10 represented in FIGS. 1 through 3. The runner 114 is shown as comprising legs 126 and 128 that carry current to and from a rectangular-shaped pad 130 on which a UBM (not shown) would be deposited and a solder bump attached, as represented by FIGS. 1 through 3. Current crowding can be demonstrated with the runner 114 of FIG. 5 by analyzing the current flow through the runner 114, its UBM and a solder bump attached to the URM when subjected to an electrical potential. In one demonstration, a numerically simulated current density pattern was observed in the UBM, wherein most of the current was concentrated along the half of the UBM perimeter nearest the legs 126 and 128.

Experimental testing was undertaken to determine the maximum current density that can be tolerated by an aluminum runner essentially identical to that shown in FIG. 5. Runners were formed on a number of semiconductor chips, each runner having a thickness of about one to four micrometers. The runners were patterned to have pads (e.g., pad 130 in FIG. 5) having dimensions of about 150 micrometers by about 500 micrometers, with each leg (e.g., 126 and 128 in FIG. 5) having a transverse width of about 118 micrometers. A UBM was formed on each runner to have an aluminum pad with a diameter of about 127 micrometers and a thickness of about 0.4 micrometer, on which was sputtered a NiVCu layer with a diameter of about 152 micrometers and a thickness of about 0.375 micrometer, yielding a pad structure similar to the UBM 120 depicted in FIGS. 3 and 4. A solder bump of near-eutectic SnPb was then formed on the pad structures, and the resulting runner-UBM-solder bump structure was subjected to varying current flow levels for extended periods of time. Based on numerical estimates of the maximum current density in each UBM, the test results indicated that excessive electromigration would occur if a current density of 35 KA/cm$^2$ was exceeded. As a result, the tested structures could be prone to electromigration if used in a high power semiconductor application, e.g., where currents of greater than 500 mA per bump are desired.

FIG. 6 represents a metal runner 14 configured to reduce the peak current density of a solder bump pad structure in accordance with an embodiment of this invention. FIG. 7 is a more detailed view of roughly half of the pad 30 of the metal runner 14 of FIG. 6, divided along a line of symmetry 58 through the center leg 28. As evident from FIG. 6, the runner 14 generally has the same outline as the prior art runner depicted in FIG. 5, including legs 26 and 28 that extend in parallel from one edge 52 of a pad 30. However, the runner 14 is modified to have discrete electrical paths 42, 44, 46, 48 and 50 (labeled in FIG. 7) within the pad 30 that are delineated and separated by nonconductive areas. These nonconductive areas are preferably defined by openings, clefts or slits 34, 36, 38 and 40, which extend completely through the thickness of the runner 14. The slits 34, 36, 38 and 40 can be readily formed during patterning of the runner 14 by conventional etching techniques. Each of the electrical paths 42, 44, 46, 48 and 50 terminate at a continuous region 32 of the pad 30. The region 32 is "continuous" in that it is not interrupted by nonconductive areas, such as the slits 34, 36, 38 and 40. From this arrangement, one can see that the electrical paths 42, 44, 46, 48 and 50 are able to distribute current around certain portions of the perimeter of the continuous region 32.

The location of a UBM 20 on the pad 30 is indicated in phantom in FIG. 7, evidencing that the paths 42, 44, 46, 48 and 50 promote the distribution of current to portions of the perimeter of the UBM 20 away from the pad edge 52, and therefore remote from the legs 26 and 28 through which current is carried to and from the UBM 20. In FIG. 7, a first electrical path 42 is located along two edges 54 and 56 of the pad 30, with a second path 44 separated from the first path 42 by the slit 34. The first path 42 is adapted to carry current to and from the side of the UBM 20 farthest from the legs 26 and 28. The second path 44 is separated from the edges 54 and 56 by the first path 42, and is adapted to deliver current to a side of the UBM 20 nearest the edge 54. Both of the first and second paths 42 and 44 extend into the leg 26 as a result of the slit 34 continuing through much of the length of the leg 26. Furthermore, the first and second paths 42 and 44 are both isolated from the edge 52 of the pad by a second slit 36. As a result of this arrangement, current carried by the leg 26 is forced to pass through the paths 42 and 44 to a portion of the UBM 20 remote from the legs 26 and 28.

A third electrical path 46 is defined between the slits 36 and 38, and includes the edge 52 of the pad 30 from which the legs 26 and 28 extend. The slit 38 continues into the leg 28, such that the electrical path 46 carries current between the leg 28 and a region of the UBM 20 nearest the edge 52. From FIG. 7, one can see that only the electrical path 46 directly carries current between the near edge 52 of the pad 30 and the region of the UBM 20 that is shown in FIG. 4 to be most susceptible to current crowding. Finally, two electrical paths 48 and 50 are represented in FIG. 7 as also distributing current to the side of the UBM 20 near the edge 52 of the pad 30, and generally opposite the side served by the path 46. These paths 48 and 50 merge near where the leg 28 meets the pad 30, but remain separated by the slit 38 from the electrical path 46 along much of the length of the leg 28.

In view of the above, the electrical paths 42 and 44 cooperate to carry current to roughly one-half of the perimeter of the UBM 20 (the upper and righthand edges of the UBM 20 as viewed in FIG. 7), while the remaining paths 46, 48 and 50 cooperate to carry current to the portion of the UBM 20 nearest the legs 26 and 28 (the lower side of the UBM 20 as viewed in FIG. 7). Together, the paths 42, 44, 48 and 50 promote the flow of electrical current to regions of the UBM 20 other than the edge of the UBM 20 nearest the edge 52, where electromigration is most likely to occur as a result of current crowding.

Figure 8:
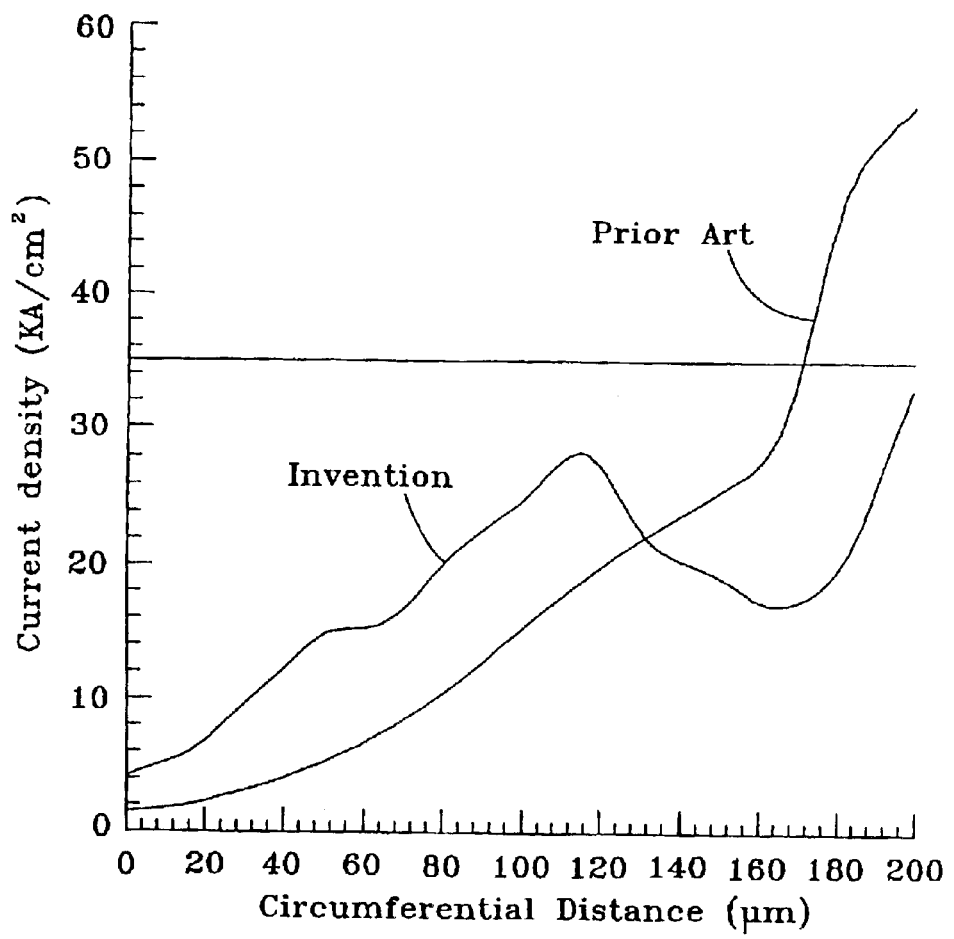
FIG. 8 is a plot comparing the current density along the perimeters of UBM's formed on the metal runners of FIGS. 5 and 6.

FIG. 8 compares the current density at the UBM-solder interface of pad structures essentially identical to those shown in FIGS. 5 and 6, with an applied potential of about 1.3 volts. The plot is for current densities along roughly one-half of the perimeter of the UBM, starting at a point farthest from the runner legs (e.g., nearest the pad edge 56 in FIG. 7) to a point nearest the legs (e.g., nearest the pad edge 52 in FIG. 7). It can be seen that using the runner 14 of this invention ("Modified"), the current density at the UBM-solder interface remains below the preestablished threshold value of 35 KA/cm$^2$, while current density far exceeds the threshold value with the prior art ("Current") runner configuration. Consequently, a solder bump electrically connected to the runner of this invention is far less likely to experience an open connection from electromigration than a solder bump on the prior art runner.

While the invention has been described in terms of a preferred embodiment, it is apparent that other forms could be adopted by one skilled in the art. Accordingly, the scope of the invention is to be limited only by the following claims.

What is claimed is:

1. A metal runner on a surface-mount circuit device, the metal runner comprising a pad portion and at least one leg portion extending therefrom, the pad portion having a continuous region surrounded by a second region containing a plurality of separate electrical paths that electrically connect the leg portion to the continuous region, the electrical paths being delineated in the second region of the pad portion by nonconductive regions defined in the pad portion.

2. A metal runner according to claim 1, wherein the nonconductive regions are defined by openings in the pad portion.

3. A metal runner according to claim 2, wherein at least some of the openings extend into the leg portion.

4. A metal runner according to claim 1, further comprising a metal pad structure on the pad portion for metallurgically bonding a solder bump thereto.

5. A metal runner according to claim 4, wherein the electrical paths radiate from a perimeter of the metal pad structure.

6. A metal runner according to claim 5, wherein the electrical paths and the openings cooperate to distribute electrical current flow between the metal runner and the medal pad structure away from a portion of the perimeter of the metal pad structure.

7. A metal runner according to claim 4, wherein the metal runner is formed of aluminum and the metal pad structure is formed of at least one metal that is more solderable than aluminum.

8. A metal runner according to claim 1, wherein the metal runner is formed of aluminum.

9. A metal runner on a flip chip, the metal runner comprising a pad portion and at least two leg portions extending therefrom, the pad portion having a continuous region surrounded by a second region containing a plurality of separate electrical paths that electrically connect the leg portions to the continuous region, the electrical paths being delineated in the second region of the pad portion by slits that extend through the pad portion in a thickness direction thereof, the electrical paths being connected to different peripheral regions of the continuous region, at least one of the slits extending into a first of the leg portions and at least a second of the slits extending into a second of the leg portions.

10. A metal runner according to claim 9, wherein at least two of the electrical paths cooperate to carry current to a region of the continuous region away from the leg portions.

11. A metal runner according to claim 9, wherein the leg portions extend from a first edge of the pad portion.

12. A metal runner according to claim 11, wherein a first of the electrical paths defines second and third edges of the pad portion.

13. A metal runner according to claim 12, wherein a second of the electrical paths is separated from the first electrical path by a first of the slits, and is separated from the second and third edges of the pad portion by the first electrical path.

14. A metal runner according to claim 13, wherein the first and second electrical paths extend into the first leg portion.

15. A metal runner according to claim 13, wherein a third of the electrical paths defines the first edge of the pad portion.

16. A metal runner according to claim 15, wherein the third electrical path extends into the second leg portion.

17. A metal runner according to claim 15, wherein the first, second and third electrical paths separate the continuous region of the pad portion from the first and second edges of the pad portion.

18. A metal runner according to claim 9, further comprising a metal pad structure on the pad portion for metallurgically bonding a solder bump thereto.

19. A metal runner according to claim 18, wherein the electrical paths contact a perimeter of the metal pad structure.

20. A metal runner according to claim 19, wherein the electrical path and the slits cooperate to carry electrical current flowing through each of the leg portions to opposite sides of the metal pad structure.

* * * * *